United States Patent
Norin et al.

(10) Patent No.: US 8,019,275 B2
(45) Date of Patent: *Sep. 13, 2011

(54) BAND UPCONVERTER APPROACH TO KA/KU SIGNAL DISTRIBUTION

(75) Inventors: John Norin, Redondo Beach, CA (US); Kesse Ho, Westminster, CA (US)

(73) Assignee: The DIRECTV Group, Inc., El Segundo, CA (US)

( * ) Notice: Subject to any disclaimer, the term of this patent is extended or adjusted under 35 U.S.C. 154(b) by 947 days.

This patent is subject to a terminal disclaimer.

(21) Appl. No.: 11/546,117

(22) Filed: Oct. 11, 2006

(65) Prior Publication Data

US 2007/0083898 A1    Apr. 12, 2007

Related U.S. Application Data (60) Provisional application No. 60/725,781, filed on Oct. 12, 2005, provisional application No. 60/725,782, filed on Oct. 12, 2005, provisional application No. 60/726,118, filed on Oct. 12, 2005, provisional application No. 60/726,149, filed on Oct. 12, 2005, provisional application No. 60/726,150, filed on Oct. 12, 2005, provisional application No. 60/726,151, filed on Oct. 12, 2005, provisional application No. 60/727,143, filed on Oct. 14, 2005, provisional application No. 60/726,338, filed on Oct. 12, 2005, provisional application No. 60/754,737, filed on Dec. 28, 2005, provisional application No. 60/758,762, filed on Jan. 13, 2006, provisional application No. 60/726,337, filed on Oct. 12, 2005.

(51) Int. Cl.
*H04H 20/74* (2008.01)

(52) U.S. Cl. ......... 455/3.02; 455/12.1; 455/427

(58) Field of Classification Search ........ 455/3.01–3.06, 455/427–430, 12.1–13.3, 168.1, 176.1, 190.1, 455/313, 334; 370/316
See application file for complete search history.

(56) References Cited

U.S. PATENT DOCUMENTS

| | | | |
|---|---|---|---|
| 3,581,209 | A | 5/1971 | Zimmerman |
| 3,670,275 | A | 6/1972 | Kalliomaki et al. |
| 4,064,460 | A | 12/1977 | Gargini |
| 4,132,952 | A | 1/1979 | Hongu et al. |
| 4,354,167 | A | 10/1982 | Terreault et al. |
| 4,382,266 | A | 5/1983 | Panzer |
| 4,397,037 | A | 8/1983 | Theriault |
| 4,403,343 | A | 9/1983 | Hamada |
| 4,509,198 | A | 4/1985 | Nagatomi |
| 4,513,315 | A | 4/1985 | Dekker et al. |

(Continued)

FOREIGN PATENT DOCUMENTS

CN    1413021    4/2003

(Continued)

OTHER PUBLICATIONS

Final Rejection dated Dec. 11, 2009 in U.S. Appl. No. 11/581,718 filed Oct. 16, 2006 by John Norin et al.

(Continued)

*Primary Examiner* — Raymond S Dean (57) ABSTRACT

Method, apparatuses, and system for selectively stacking systems are disclosed. A system in accordance with the present invention comprises satellite signals broadcast in a first frequency band, that are downconverted to a first intermediate frequency (IF) band of signals, and different satellite signals broadcast in a second frequency band that are downconverted to a second IF band of signals and a third IF band of signals. The first, second, and third IF bands of signals are all present in a combined IF signal on a cable.

20 Claims, 5 Drawing Sheets

U.S. PATENT DOCUMENTS

| | | | |
|---|---|---|---|
| 4,530,008 A | 7/1985 | McVoy |
| 4,532,543 A | 7/1985 | Groenewegen |
| 4,538,175 A | 8/1985 | Balbes et al. |
| 4,545,075 A | 10/1985 | Miller et al. |
| 4,556,988 A | 12/1985 | Yoshisato |
| 4,592,093 A | 5/1986 | Ouchi et al. |
| 4,608,710 A | 8/1986 | Sugiura |
| 4,628,506 A | 12/1986 | Sperlich |
| 4,656,486 A | 4/1987 | Turner |
| 4,663,513 A | 5/1987 | Webber |
| 4,667,243 A | 5/1987 | Blatter et al. |
| 4,672,687 A | 6/1987 | Horton et al. |
| 4,675,732 A | 6/1987 | Oleson |
| 4,710,972 A | 12/1987 | Hayashi et al. |
| 4,723,320 A | 2/1988 | Horton |
| 4,761,825 A | 8/1988 | Ma |
| 4,761,827 A | 8/1988 | Horton et al. |
| 4,785,306 A | 11/1988 | Adams |
| 4,802,239 A | 1/1989 | Ooto |
| 4,805,014 A | 2/1989 | Sahara et al. |
| 4,813,036 A | 3/1989 | Whitehead |
| 4,823,135 A | 4/1989 | Hirashima et al. |
| 4,860,021 A | 8/1989 | Kurosawa et al. |
| 4,866,787 A | 9/1989 | Olesen |
| 4,876,736 A | 10/1989 | Kiewit |
| 4,885,803 A | 12/1989 | Hermann et al. |
| 4,903,031 A | 2/1990 | Yamada |
| 4,945,410 A | 7/1990 | Walling |
| 5,010,400 A | 4/1991 | Oto |
| 5,027,430 A | 6/1991 | Yamauchi et al. |
| 5,068,918 A | 11/1991 | Verheijen et al. |
| 5,073,930 A | 12/1991 | Green et al. |
| 5,119,509 A | 6/1992 | Kang |
| 5,235,619 A | 8/1993 | Beyers, II et al. |
| 5,249,043 A | 9/1993 | Grandmougin |
| 5,276,904 A | 1/1994 | Mutzig |
| 5,289,272 A | 2/1994 | Rabowsky et al. |
| 5,301,352 A | 4/1994 | Nakagawa et al. |
| 5,382,971 A | 1/1995 | Chanteau |
| 5,437,051 A | 7/1995 | Oto |
| 5,521,631 A | 5/1996 | Budow et al. |
| 5,565,805 A | 10/1996 | Nakagawa et al. |
| 5,572,517 A | 11/1996 | Safadi |
| 5,574,964 A | 11/1996 | Hamlin |
| 5,587,734 A | 12/1996 | Lauder et al. |
| 5,617,107 A | 4/1997 | Fleming |
| 5,675,390 A | 10/1997 | Schindler et al. |
| 5,708,961 A | 1/1998 | Hylton et al. |
| 5,734,356 A | 3/1998 | Chang |
| 5,748,732 A | 5/1998 | Le Berre et al. |
| 5,760,819 A | 6/1998 | Sklar et al. |
| 5,760,822 A | 6/1998 | Coutinho |
| 5,787,335 A | 7/1998 | Novak |
| 5,790,202 A | 8/1998 | Kummer et al. |
| 5,793,413 A | 8/1998 | Hylton et al. |
| 5,805,806 A | 9/1998 | McArthur |
| 5,805,975 A | 9/1998 | Green et al. |
| 5,835,128 A | 11/1998 | Macdonald et al. |
| 5,838,740 A | 11/1998 | Kallman et al. |
| 5,848,239 A | 12/1998 | Ando |
| 5,864,747 A | 1/1999 | Clark et al. |
| 5,883,677 A | 3/1999 | Hofmann |
| 5,886,995 A | 3/1999 | Arsenault et al. |
| 5,898,455 A | 4/1999 | Barakat et al. |
| 5,905,941 A | 5/1999 | Chanteau |
| 5,905,942 A | 5/1999 | Stoel et al. |
| 5,923,288 A | 7/1999 | Pedlow, Jr. |
| 5,936,660 A | 8/1999 | Gurantz |
| 5,959,592 A | 9/1999 | Petruzzelli |
| 5,970,386 A | 10/1999 | Williams |
| 5,982,333 A | 11/1999 | Stillinger et al. |
| 6,005,861 A | 12/1999 | Humpleman |
| 6,011,597 A | 1/2000 | Kubo |
| 6,023,603 A | 2/2000 | Matsubara |
| 6,038,425 A | 3/2000 | Jeffrey |
| 6,100,883 A | 8/2000 | Hoarty |
| 6,104,908 A | 8/2000 | Schaffner et al. |
| 6,134,419 A | 10/2000 | Williams |
| 6,147,714 A | 11/2000 | Terasawa et al. |
| 6,173,164 B1 | 1/2001 | Shah |
| 6,188,372 B1 | 2/2001 | Jackson et al. |
| 6,192,399 B1 | 2/2001 | Goodman |
| 6,198,449 B1 | 3/2001 | Muhlhauser et al. |
| 6,198,479 B1 | 3/2001 | Humpleman et al. |
| 6,202,211 B1 | 3/2001 | Williams, Jr. |
| 6,292,567 B1 | 9/2001 | Marland |
| 6,304,618 B1 | 10/2001 | Hafeez et al. |
| 6,340,956 B1 | 1/2002 | Bowen et al. |
| 6,397,038 B1 | 5/2002 | Green, Sr. et al. |
| 6,424,817 B1 | 7/2002 | Hadden |
| 6,430,233 B1 | 8/2002 | Dillon et al. |
| 6,430,742 B1 | 8/2002 | Chanteau |
| 6,441,797 B1 | 8/2002 | Shah |
| 6,442,148 B1 | 8/2002 | Adams et al. |
| 6,452,991 B1 | 9/2002 | Zak |
| 6,463,266 B1 | 10/2002 | Shohara |
| 6,486,907 B1 | 11/2002 | Farber |
| 6,493,873 B1 | 12/2002 | Williams |
| 6,493,874 B2 | 12/2002 | Humpleman |
| 6,501,770 B2 | 12/2002 | Arsenault et al. |
| 6,510,152 B1 | 1/2003 | Gerszberg et al. |
| 6,549,582 B1 | 4/2003 | Friedman |
| 6,574,235 B1 | 6/2003 | Arslan et al. |
| 6,598,231 B1 | 7/2003 | Basawapatna et al. |
| 6,600,730 B1 | 7/2003 | Davis et al. |
| 6,600,897 B1 | 7/2003 | Watanabe et al. |
| 6,622,307 B1 | 9/2003 | Ho |
| 6,653,981 B2 | 11/2003 | Wang et al. |
| 6,728,513 B1 | 4/2004 | Nishina |
| 6,762,727 B2 | 7/2004 | Rochford et al. |
| 6,864,855 B1 | 3/2005 | Fujita |
| 6,865,193 B2 | 3/2005 | Terk |
| 6,879,301 B2 | 4/2005 | Kozlovski |
| 6,889,385 B1 | 5/2005 | Rakib et al. |
| 6,906,673 B1 | 6/2005 | Matz et al. |
| 6,941,576 B2 | 9/2005 | Amit |
| 6,944,878 B1 | 9/2005 | Wetzel et al. |
| 7,010,265 B2 | 3/2006 | Coffin, III |
| 7,016,643 B1 | 3/2006 | Kuether et al. |
| 7,020,081 B1 | 3/2006 | Tani et al. |
| 7,039,169 B2 | 5/2006 | Jones |
| 7,069,574 B1 | 6/2006 | Adams et al. |
| 7,085,529 B1 | 8/2006 | Arsenault et al. |
| 7,130,576 B1 | 10/2006 | Gurantz et al. |
| 7,239,285 B2 | 7/2007 | Cook |
| 7,257,638 B2 | 8/2007 | Celik et al. |
| 7,260,069 B2 | 8/2007 | Ram et al. |
| 7,263,469 B2 | 8/2007 | Bajgrowicz et al. |
| 7,519,680 B1 | 4/2009 | O'Neil |
| 7,522,875 B1 | 4/2009 | Gurantz et al. |
| 7,542,715 B1 | 6/2009 | Gurantz et al. |
| 7,603,022 B2 | 10/2009 | Putterman et al. |
| 2001/0055319 A1 | 12/2001 | Quigley et al. |
| 2002/0044614 A1 | 4/2002 | Molnar |
| 2002/0140617 A1 | 10/2002 | Luly et al. |
| 2002/0152467 A1 | 10/2002 | Fiallos |
| 2002/0154055 A1 | 10/2002 | Davis et al. |
| 2002/0154620 A1 | 10/2002 | Azenkot et al. |
| 2002/0178454 A1 | 11/2002 | Antoine et al. |
| 2002/0181604 A1 | 12/2002 | Chen |
| 2003/0023978 A1 | 1/2003 | Bajgrowitz |
| 2003/0129960 A1 | 7/2003 | Kato |
| 2003/0185174 A1 | 10/2003 | Currivan |
| 2003/0217362 A1 | 11/2003 | Summers et al. |
| 2003/0220072 A1 | 11/2003 | Coffin, III |
| 2004/0060065 A1 | 3/2004 | James et al. |
| 2004/0064689 A1 | 4/2004 | Carr |
| 2004/0068747 A1 | 4/2004 | Robertson et al. |
| 2004/0136455 A1 | 7/2004 | Akhter et al. |
| 2004/0153942 A1 | 8/2004 | Shtutman et al. |
| 2004/0161031 A1 | 8/2004 | Kwentus et al. |
| 2004/0184521 A1 | 9/2004 | Chen et al. |
| 2004/0192190 A1 | 9/2004 | Motoyama |
| 2004/0198237 A1 | 10/2004 | Abutaleb et al. |
| 2004/0203425 A1 | 10/2004 | Coffin |
| 2004/0229583 A1 | 11/2004 | Ogino |
| 2004/0244044 A1 | 12/2004 | Brommer |

| | | | |
|---|---|---|---|
| 2004/0244059 | A1 | 12/2004 | Coman |
| 2004/0255229 | A1 | 12/2004 | Shen et al. |
| 2004/0261110 | A1 | 12/2004 | Kolbeck et al. |
| 2005/0002640 | A1 | 1/2005 | Putterman et al. |
| 2005/0033846 | A1 | 2/2005 | Sankaranarayan et al. |
| 2005/0052335 | A1 | 3/2005 | Chen |
| 2005/0054315 | A1 | 3/2005 | Bajgrowicz et al. |
| 2005/0057428 | A1 | 3/2005 | Fujita |
| 2005/0060525 | A1 | 3/2005 | Schwartz, Jr. et al. |
| 2005/0066367 | A1 | 3/2005 | Fyke et al. |
| 2005/0071882 | A1 | 3/2005 | Rodriguez et al. |
| 2005/0118984 | A1 | 6/2005 | Akiyama et al. |
| 2005/0138663 | A1 | 6/2005 | Throckmorton et al. |
| 2005/0184923 | A1 | 8/2005 | Saito et al. |
| 2005/0190777 | A1 | 9/2005 | Hess et al. |
| 2005/0193419 | A1 | 9/2005 | Lindstrom et al. |
| 2005/0198673 | A1 | 9/2005 | Kit et al. |
| 2005/0204388 | A1 | 9/2005 | Knudson et al. |
| 2005/0229206 | A1 | 10/2005 | Pugel et al. |
| 2005/0240969 | A1 | 10/2005 | Sasaki et al. |
| 2005/0264395 | A1 | 12/2005 | Bassi |
| 2005/0289605 | A1 | 12/2005 | Jeon |
| 2006/0018345 | A1 | 1/2006 | Nadarajah et al. |
| 2006/0030259 | A1 | 2/2006 | Hetzel et al. |
| 2006/0041912 | A1 | 2/2006 | Kuhns |
| 2006/0080707 | A1 | 4/2006 | Laksono |
| 2006/0133612 | A1 | 6/2006 | Abedi et al. |
| 2006/0174282 | A1 | 8/2006 | Dennison et al. |
| 2006/0225104 | A1 | 10/2006 | James et al. |
| 2006/0259929 | A1 | 11/2006 | James |
| 2006/0294512 | A1 | 12/2006 | Seiden |
| 2007/0089142 | A1* | 4/2007 | Norin et al. ............ 725/63 |
| 2007/0202800 | A1 | 8/2007 | Roberts et al. |
| 2008/0064355 | A1 | 3/2008 | Sutskover et al. |
| 2008/0193419 | A1 | 8/2008 | Lorence et al. |
| 2009/0013358 | A1 | 1/2009 | Throckmorton et al. |
| 2009/0150937 | A1 | 6/2009 | Ellis et al. |
| 2009/0222875 | A1 | 9/2009 | Cheng et al. |
| 2009/0252316 | A1 | 10/2009 | Ratmanski et al. |

FOREIGN PATENT DOCUMENTS

| | | |
|---|---|---|
| DE | 197 49 120 | 6/1999 |
| DE | 10155481 | 5/2003 |
| EP | 1207688 | 5/2002 |
| EP | 1331810 | 7/2003 |
| EP | 1447987 | 8/2004 |
| FR | 2861939 | 5/2005 |
| GB | 2354650 | 3/2001 |
| WO | WO 97/19554 | 5/1997 |
| WO | 0150290 | 7/2001 |
| WO | WO 01/56297 | 8/2001 |
| WO | 02082351 | 10/2002 |
| WO | 03026187 | 2/2003 |
| WO | 2004054128 | 6/2004 |
| WO | WO 2004/054128 | 6/2004 |
| WO | WO 2004/105283 | 12/2004 |
| WO | 2005094075 | 10/2005 |
| WO | 2005114879 | 12/2005 |
| WO | 2006015196 | 2/2006 |
| WO | 2006017218 | 2/2006 |
| WO | WO 2006/026477 | 3/2006 |

OTHER PUBLICATIONS

Non-final Office action dated Jan. 12, 2010 in U.S. Appl. No. 11/546,116 filed Oct. 11, 2006 by John L. Norin et al.

Non-final Office dated May 26, 2009 in U.S. Appl. No. 11/581,718 filed Oct. 16, 2006 by John Norin et al.

"Digital Satellite Equipment Control, Bus Functional Specification"; Bus Functional Specification; Eutelsat; Paris, France; Feb. 25, 1998; XP002348247; entire document.

Muller, Klaus; "DisEqC-controlled Sat-Installations"; RFE Radio Fernsehen Elektronik; Huss Medien GMBH; Berlin, Germany; vol. 46, No. 5; May 1997; pp. 42-44; XP000731482 (original and English translation).

U.S. Appl. No. 10/255,344, filed Sep. 25, 2002, Thomas H. James, Non-final Communication dated Aug. 1, 2007.

Mussino, F., "Reception and distribution techniques for DBS signals in community antenna installations," Accession No. 2781941, Alta Frequenza, 55(2):105-11, Mar.-Apr. 1986—Abstract Only.

Mussino, F., "Evolution of the receiving and distribution installations of television signals: from terrestrial broadcasting to satellite broadcasting," Accession No. 2742699, Proc. Of the 32$^{nd}$ Congress on Electronics: Satellite Broadcasting, 243-50, 1985—Abstract Only.

Mussino, F., "The reception of direct broadcast satellite TV signals in the 12 GHz band, using the C-MAC packet system," Accession No. 2325813, Elettronica e Telecomunicazioni, 33(3):117-30, May-Jun. 1984—Abstract Only.

Mussino, F., "Centralized aerial systems [cable TV]," Accession No. 2306051, Radioindustria Elettronica—Televizione, 7(11):491-4, Nov. 1983—Abstract Only.

Chaplin, J.G., et al., "Satellite broadcast reception: the FM approach to signal distribution in individual and community antenna systems," Accession No. 2241798, EBU Review, Technical No. 202:274-81, Dec. 1983—Abstract Only.

Mussino, F., "Cabled distribution systems; wide-band and channelized reception methods," Accession No. 2207325, Elettronica e Telecomunicazoni, 32(5):229-33, Sep.-Oct. 1983—Abstract Only.

Mussino, F., "Intermodulation characteristics of the television broadcast satellite receivers," Accession No. 2095285, Alta Frequenza, 52(2):118-25, Mar.-Apr. 1983, Abstract Only.

Mussino, F., "Some problems of television reception," Accession No. 1850235, Electronica e Telecomunicazioni, 30(4):165-70, Jul.-Aug. 1981, Abstract Only.

Bava, G. et al., "Characteristics and structure of receivers for direct TV radiodiffusion by satellite in the 12 GHz band," Accession No. 1512676, Alta Frequenza, 48(12):714-25, Dec. 1979, Abstract Only.

Mussino, F., "Synchronous demodulator for television signals," Accession No. 1497282, Elettronica e Telecomunicazioni, 28(3):101-7, May-Jun. 1979, Abstract Only.

Mussino, F., "Windscreen antenna," Accession No. 1315746, Alta Frequenza, 47(10):720-7, Oct. 1978, Abstract Only.

Mussino, F., "Characteristics and problems with centralised antennae," Accession No. 1290455, Radioindustria Elettronica—Televizione 4:203-8, Apr. 1978, Abstract Only.

Mussino, F., "EMC measurements on the electrical equipment of cars," Accession No. 1117953, 2$^{nd}$ symposium and technical exhibition on electromagnetic compatibility, 131-3, 1977, Abstract Only.

Mussino, F., "RF impedance of the electrical network of cars," Accession No. 1000748, International Symposium on Electromagnetic Compatibility, 418-23, 1976, Abstract Only.

Beccari, C. et al, "All-pass networks with constant phase difference," Accession No. 980800, Elettronica e Telecomunicazioni, 25(3):117-22, May-Jun. 1976, Abstract Only.

Mussino, F., "Measuring methods for CATV systems proposed by IEC," Accession No. 945815, Elettronica e Telecomunicazioni, 25(1):29-34, Jan.-Feb. 1976, Abstract Only.

Mussino, F., "Characteristics of CATV systems proposed by IEC," Accession No. 909134, Elettronica e Telecomunicazioni, 24(6):243-5, Nov.-Dec. 1975, Abstract Only.

Mussino, F., "Antenna amplifier for field strength measurements on wide frequency band," Accession No. 544273, Elettronica e Telecomunicazioni, 22(2):49-52, Mar.-Apr. 1973, Abstract Only.

Mussino, F., "FM receiver with coherent demodulation," Accession No. 320402, Elettronica e Telecomunicazioni, 20(4):133-7, 1971, Abstract Only.

Mussino, F., "Coherent detection receivers for radio and television broadcasting," Accession No. 273689, Elettronica e Telecomunicazioni, 20(2):57-69, Mar.-Apr. 1971, Abstract Only.

Mussino, F. et al., "Stereophonic transmission system using double carrier modulation," Accession No. 208381, Proceedings of the 17$^{th}$ international congress on electronics, 415-21, 1970, Abstract Only.

Mussino, F., "A means of continuously varying phase," Accession No. 89438, Elettronica e Telecomunicazioni, 18(4):118-24, Jul. 1969, Abstract Only.

Carrillo, J.A. et al., "Stereophonic reception noise figure of 'pilot frequency' systems," Accession No. 22497, Elettronica e Telecomunicazioni, 17(5):162-6, Sep. 1968, Abstract Only.

Di Zenobio, D. et al., "A switching circuit scheme for a satellite site diversity system," Accession No. 3316999, 1988 IEEE International Symposium on Circuits and Systems. Proceedings (Cat. No. 88CH2458-8), 1:119-22, Abstract Only.

Holtstiege, H., "Satellite reception-tips and tricks of an expert," Accession No. 3132408, Funkschau, 4:57-8, 61-2, Feb. 12, 1988, Abstract Only.

Cominetti, M. et al., "Distribution of DBS signals of the MAC-family in collective antenna systems," Accession No. 3117800, New Systems and Services in Telecommunications, III; Networks, Cables, Satellites—The What, the How, the Why? Proceedings of the Third International Conference; 417-25, 1987, Abastract Only.

O'Neill, H.J. et al., "The distribution of C-MAC in cable systems," Accession No. 2856976, Cable Television Engineering, 13(7):294-301, Dec. 1986, Abstract Only.

Lowell, R.R. et al., "NASA's communication program examined for the 1980s and 1990s. I," Accession No. 2801869, MSN Microwave Systems News & Communications Technology, 16(9):79-81, 83-5, 87-8, 90, Aug. 1986, Abstract Only.

Kudsia, C.M. et al., "RF channel characteristics and enhanced performance in future DBS satellites at 12 GHz in Region 2," Accession No. 2759373, AIAA 11$^{th}$ Communication Satellite Systems Conference. Collection of Technical Papers: 220-4, 1986, Abstract Only.

Baker, S., "Eutelsat in the 90s," Accession No. 2569799, Cable & Satellite Europe, 7:9-12, Jul. 1985, Abstract Only.

Hessenmuller, H., "The progress towards a unified colour television standard for satellite broadcasting in Europe," Accession No. 2569494, Fernmelde-Ingenieur, 39(8):1-36, Aug. 1985, Abstract Only.

Sultan, N. et al., "Reconfigurable dual feed antenna for direct broadcast satellites," Accession No. 2496781, Acta Astronautica, 12(1):27-35, Jan. 1985, Abstract Only.

Gandy, C., "Antenna requirements and design options for DBS domestic reception," Accession No. 2358182, IBC 84. International Broadcasting Convention (Proceedings No. 240): 251-3, 1984, Abstract Only.

Renton, C., "RCA satcom Ku-band antenna system," Accession No. 2867860, AP-S International Symposium 1986. 1986 International Symposium Digest Antennas and Propagation (Cat. No. 86CH2325-9) 1:157-60, 1986, Abstract Only.

Sultan, N. et al., "A reconfigurable multiple shaped beam reflector antenna for direct broadcast satellite," Accession No. 2079246, Third International Conference on Antennas and Propagation ICAP 83: 203-7, pt. 1, 1983, Abstract Only.

Palumbo, B., "Dual polarized two-frequence slot array for a satellite electronically despun antenna," Accession No. 184451, 1969 European microwave conference: 147, 1970, Abstract Only.

Lenormand, R. et al., "CAD for HERMES antennas," Accession No. 3317368, AP-S Intenational Symposium 1988. 1988 International Symposium Digest: Antennas and Propagation (Cat. No. 88CH2563-5): 1:26-9, 1988, Abstract Only.

Naderi, F.M., "ACTS: the first step toward a switchboard in the sky," Accession No. 3190134, Telematics and Informatics, 5(1):13-20, 1988, Abstract Only.

Noda, H. et al., "Satellite Tv receiving system," Accession No. 3152051, JRC Review, 26:45-50, 1988, Abstract Only.

Binder, R. et al., "The multiple satellite system-low altitude survivable communications," Accession No. 3095999, MILCOM 87: 1987 IEEE Military Communications Conference. 'Crisis Communications: The Promise and Reality'. Conference Record (Cat. No. 87CH2493-5), 2:620-5, 1987, Abstract Only.

Hori, T. et al., "Electronically steerable spherical array antenna for mobile earth station," Accession No. 2935203, Fifth International Conference on Antennas and Propagation (ICAP 87) (Conf. Publ. No. 274), 1:55-8, 1987, Abstract Only.

Yamamoto, H. et al., "Communications equipment for multibeam satellites," Accession No. 2727289, Telecommunication technologies 1985/1986: 109-18, 1985, Abstract Only.

Thurl, W. et al., "Satellite receiving station for TV programme distribution," Accession No. 2480868, Mikrowellen Magazin, 10(6):604-6, Dec. 1984, Abstract Only.

Alaria, G.B. et al., "SS/TDMA satellie system with on board TST switching stage," Accession No. 2342421, CSELT Rapporti Tecnici, 12(3):247-55, Jun. 1984, Abstract Only.

Kudrna, K., "Preliminary test results of the electronic switching spherical array antenna," Accession No. 2324225, ITC/USA/'83. International Telemetering Conference: 11-17, 1983, Abstract Only.

Vidal Saint-Andre, B. et al., "A multi-element primary feed system and associated switch device designed for TDMA communication satellites," Accession No. 2290842, Annales des Telecommunications, 39(1-2):76-83, Jan.-Feb. 1984, Abstract Only.

Bongiovanni, G., et al., "Optimal switching algorithm for multibeam satellite systems with variable bandwidth beams," Accession No. 2258153, IBM Technical Disclosure Bulletin, 26(8):4344-8, Jan. 1984, Abstract Only.

Saint-Andre, B.V., et al., "A multi-element primary feed system and associated switch device designed for TDMA communication satellites," Accession No. 2257271, GLOBECOM '83. IEEE Global Telecommunications Conference. Conference Record: 3:1645-9, 1983, Abstract Only.

Spisz, E.W., "NASA development of a satellite switched SS-TDMA IF switch matrix," Accession No. 2241614, CECON '83 Record: Cleveland Electrical/Electronics Conference and Exposition 1983: 19-27, Nov. 1983, Abstract Only.

Kudrna, K. et al., "The Electronica Switching Spherical Array (ESSA) antenna for the Earth Radiation Budget Spacecraft (ERBS)," Accession No. 2148187, ITC/USA/82. International Telemetering Conference, 271-88, 1982, Abstract Only.

Kumagai, H. et al., "20 GHz band receiving facilities at sub-earth-station for CS site diversity switching experiments," Accession No. 2147104, Review of the Radio Research Laboratories, 28(147):553-60, Sep. 1982, Abstract Only.

Kennedy, W.A., "UHE airborne satcom antenna systems," Accession No. 2111199, Midcon/80 Conference Record: 8/1/1-6, 1980, Abstract Only.

Grant, I. et al., "The SKYSWITCH project," Accession No. 2111056, Telecommunications, 17(1):80, 88, Jan. 1983, Abstract Only.

King-tim, Ko et al., "A space-division multiple-access protocol for spot-beam antenna and satellite-switched communication network," Accession No. 2079577, IEEE Journal on Selected Areas in Communications, vol. SAC-1, No. 1:126-32, Jan. 1983, Abstract Only.

Farrell, P.G., "Modulation and coding," Accession No. 2464817, International Journal of Satellite Communications, 2(4):287-304, Oct.-Dec. 1984, Abstract Only.

Beach, M.A. et al., "An adaptive antenna array for future land mobile satellite terminals," Accession No. 3416971, Sixth International Conference on Antennas and Propagation (ICAP 89) (Conf. Publ. No. 301), 1:326-30, 1989, Abstract Only.

Johannsen, K.G., "Ground station tracking of dual linearly polarized satellites," Accession No. 922037, IEEE Transactions on Aerospace and Electronic Systems, vol. AED-11, No. 6: 133345, Nov. 1975, Abstract Only.

Harvey, R.V., "Simplifying the planning of frequency assignments for satellite broadcasting," Accession No. 1069917, EBU Review, Technical 159:218-26, Oct. 1976, Abstract Only.

Nakagawa, M., "Satellite broadcasting in Japan," Accession No. 3473565, AEU 3:50-3, 1989, Abstract Only.

Vuong, X.T. et al., "Some practical strategies for reducing intermodulation in satellite communications," Accession No. 3401833, IEEE Transactions on Aerospace and Electronica Systems, 24(6):755-65, Nov. 1988, Abstract Only.

Poulton, G.T. et al., "Earth-station antennas for multiple satellite access," Accession No. 3352237, Journal of Electrical and Electronics Engineering, Australia, 8(3):168-76, Sep. 1988, Abstract Only.

Alper, A.T., "Capacity allocation in a multi-transponder communications satellite with a common reconfigurable multiple-beam antenna," Accession No. 1790796, IEEE 1981 International Conference on Communications, 54.5/1-5, vol. 3, 1981, Abstract Only.

Matsushita, M. et al., "Some considerations on achieving optimum receiving systems for satellite broadcasting," Accession No. 306770, Proceedings of the 8$^{th}$ international symposium on space technology and science, 719-25, 1969, Abstract Only.

Lewis, V., "SMATV-Phase 1-updating MATV systems (UK)," Electronic Technology 23(1):Jan. 10-15, 1989, Abstract Only.

Keen, K.M. et al., "Techniques for the measurement of the cross-polarisation radiation patterns of linearly polarised, polarisation-diversity satellite ground-station antennas," Accession No. 1933335, IEE Proceedings H (Microwaves, Optics and Antennas) 129(3):103-8, Jun. 1982, Abstract Only.

DiFonzo, D.F., "Antennas: Key to communications satellite growth," Accession No. 1279523, Microwave Systems News 8(6):83-5, 87, 90-1, Jun. 1, 1978, Abstract Only.

Dement, D.K., "NASA's revitalized role in satellite communications," Accession No. 1527953, IEEE Communications Magazine, 18(1):37-41, Jan. 1980, Abstract Only.

Kalliomaki, K. et al., "Electronically tracking antenna system for satellite reception," Accession No. 150587, IEEE Transactions on Aerospace and Electronic Systems, vol. AES-6, No. 3:405-7, May 1970, Abstract Only.

Inoue, T. et al., "30/20 GHz band SCPC satellite communication using small earth stations," Accession No. 2191343, IEEE Journal on Selected Areas in Communications, vol.SAC-1, No. 4:600-8, Sep. 1983, Abstract Only.

Jacobs, I.M. et al., "Trends in military satellite communication networks," Accession No. 1611408, AIAA 8th Communications Satellite Systems Conference 762-5, 1980, Abstract Only.

Davies, R. et al., "Packet communications in satellites with multiple-beam antennas and signal processing," Accession No. 1611382, AIAA 8th Communications Satellite Systems Conference, 378-85, 1980, Abstract Only.

Raymond, H.G. et al., "An advanced mixed user domestic satellite system architecture," Accession No. 1611364, AIAA 8th Communications Satellite Systems Conference, 148-53, 1980, Abstract Only.

Pennoni, G. et al., "An SS-TDMA satellite system incorporating an onboard time/space/time switching facility: overall system characteristics and equipment description," Links for the Future. Science, Systems & Services for Communications. Proceedings of the International Conference on Communications-ICC 84, 2:800-6, 1984, Abstract Only.

Greborio, G.B., "Direct Satellite Television: Distribution System for New Centralized Antenna Installations," Electronics and Telecommunications, 6:271-284, 1984.

Chaplin, J.G. et al., "Satellite broadcast reception: the FM approach to signal distribution in individual and community antenna systems," EBU Review, Technical No. 202, Dec. 1983, 11 pgs.

Sharifi, M.H. et al., "A Multiple Access Technique for Centralized Multiple Satellite Networking with On-Board Processing in the Central Node," IEEE, 1012-1021, 1988.

Schmidt, R.L. et al., "Transmission of Two NTSC Color Television Signals Over a Single Satellite Transponder Via Time-Frequency Multiplexing," IEEE Transactions on Communications, vol. Com-31, 11:1257-1266, Nov. 1983.

Pfund, E.T., "Direct Television Broadcasting with a Medium-Size Satellite," IEEE, 121-129, 1988.

Lee, L-S., "A Polarization Control System for Satellite Communications with Multiple Uplinks," IEEE Transactions on Communications, vol. Com-26, No. 8, 1201-1211, Aug. 1978.

Naderi, F.M., "Advance Satellite Concepts for Future Generation VSAT Networks," IEEE Communications Magazine, Sep. 13-22, 1988.

Granlund, J. et al., "Diversity Combining for Signals of Different Medians," IRE Transactions on Communications Systems, 138-145, 1961.

Davies, P.G. et al., "Measurements of SIRIO Transmissions near 11.6 GHz at Slough (UK)," Alta Frequenza, 332-158 E—338-164 E, 1979.

Chakraborty, D., "Survivable Communication Concept Via Multiple Low Earth-Orbiting Satellites," IEEE Transactions on Aerospace and Electronic Systems, 25(6):879-889, Nov. 1989.

Buntschuh, R.F., "First-Generation RCA Direct Broadcast Satellites," IEEE Journal on Selected Areas in Communications, vol. SAC-3, No. 1, 126-134, Jan. 1985.

Bridle, M., "Satellite Broadcasting in Australia," IEEE Transactions on Broadcasting, vol. 34, No. 4, 425-429, Dec. 1988.

Bertossi, A.A. et al., "Time Slot Assignment in SS/TDMA Systems with Intersatellite Links," IEEE Transactions on Communications, vol. Com-35, No. 6, 602-608, Jun. 1987.

Stephens, G.M., "European DBS: On the Brink," Satellite Communications, Jul. 1988.

Weinberg, A., "On the Passage of High-Level Pulsed Radio Frequency Interference Through a Nonlinear Satellite Transponder," IEEE Transactions on Communications, vol. Com-32, No. 1, Jan. 13-24, 1984.

Tasaka, S., "The SRUC Protocol for Satellite Packet Communication—A Performance Analysis," IEEE Transactions on Communications, vol. Com-34, No. 9, 937-945, Sep. 1986.

Seth, A.K., "Satellite Communication Experiments in the Country," J. Instn. Electronics & Telecom. Engrs., 28(5):199-207, 1982.

Saleh, A.A.M. et al., "Distributed Antennas for Indoor Radio Communications," IEEE Transactions on Communications, vol. Com-35, No. 12, 1245-1251, Dec. 1987.

Jeruchim, M.C., "On the Application of Importance Sampling to the Simulation of Digital Satellite and Multihop Links," IEEE Transactions on Communications, vol. Com-32, No. 10, 1088-1104, Oct. 1984.

Kavehrad, M., "Direct-Sequence Spread Spectrum with DPSK Modulation and Diversity for Indoor Wireless Communications," IEEE Transactions on Communications, vol. Com-35, No. 2, 224-241, Feb. 1987.

Mosely, J. et al., "A Class of Efficient Contention Resolution Algorithms for Multiple Access Channels," IEEE Transactions on Communications, vol. Com-33, No. 2, 145-151, Feb. 1985.

Jain, C.L. et al., "A Direct Reception System for Time Synchronization Via InSat-1," J. Instn. Electronics & Teleom. Engrs, 27(10):470-476, 1981.

Gopal, I.S., et al., "Scheduling in Multibeam Satellites with Interfering Zones," IEEE Transactions on Communications, vol. Com-31, No. 8, 941-951, Aug. 1983.

Gopal, I.S. et al., "Point-to-Multipoint Communication Over Broadcast Links," IEEE Transactions on Communications, vol. Com-32, No. 9, 1034-1049, Sep. 1984.

Gole, P. et al., "Effect of Ice-Induced Cross-Polarization on Digital Earth-Space Links," IEEE Transactions on Communications, vol. Com-32, No. 1, 70-81, Jan. 1984.

Jacobs, I.M. et al., "Trends in Military Satellite Communication Networks," American Institute of Aeronautics and Astronautics, Inc., 762-765, 1980.

Glance, B. et al., "Frequency-Selective Fading Effects in Digital Mobile Radio with Diversity Combining," IEEE Transactions on Communications, vol. Com-31, No. 9, 1085-1094, Sep. 1983.

Cox, D.C., "Antenna Diversity Performance in Mitigating the Effects of Portable Radiotelephone Orientation and Multipath Propagation," IEEE Transactions on Communications, vol. Com-31, No. 5, 620-628, May 1983.

Cimini, Jr., L.J., "Analysis and Simulation of a Digital Mobile Channel Using Orthogonal Frequency Division Multiplexing," IEEE Transactions on Communications, vol. Com-33, No. 7, 665-675, Jul. 1985.

Cartledge, J.C., "Outage Performance of QAM Digital Radio Using Adaptive Equalization and Switched Space Diversity Reception," IEEE Transactions on Communications, vol. Com-35, No. 2, 166-180, 1987.

Dubrovnik, International Telecommunication Union, Recommendations and Reports of the CCIR, 1986, CCIR Report 473-4, pp. 190-211 (see 198-200, 204)—XVIth Plenary Assembly, 1986—vols. X and XI—Part 2, Broadcasting Satellite Service (Sound and Television).

Notice of Allowance dated Mar. 17, 2011 in U.S. Appl. No. 11/546,116 filed Oct. 11, 2006 by John L. Norin et al.

Final Rejection dated Mar. 31, 2011 in U.S. Appl. No. 11/581,718 filed Oct. 16, 2006 by John Norin et al.

Notice of Allowance dated Aug. 10, 2010 in U.S. Appl. No. 11/546,116 filed Oct. 11, 2006 by John Norin et al.

* cited by examiner

BAND UPCONVERTER APPROACH TO KA/KU SIGNAL DISTRIBUTION

CROSS-REFERENCE TO RELATED APPLICATIONS

This application claims the benefit under 35 U.S.C. §119 (e) of the following co-pending and commonly-assigned U.S. provisional patent applications:

Application Ser. No. 60/725,781, filed on Oct. 12, 2005 by John L. Norin and Kesse Ho, entitled "TRIPLE STACK COMBINING APPROACH TO Ka/Ku SIGNAL DISTRIBUTION,"

Application Ser. No. 60/725,782, filed on Oct. 12, 2005 by Kesse Ho and John L. Norin, entitled "SINGLE LOCAL OSCILLATOR SHARING IN MULTI-BAND KA-BAND LNBS,";

Application Ser. No. 60/726,118, filed on Oct. 12, 2005 by John L. Norin, entitled "KA/KU ANTENNA ALIGNMENT,"

Application Ser. No. 60/726,149, filed on Oct. 12, 2005 by Kesse Ho, entitled "DYNAMIC CURRENT SHARING IN KA/KU LNB DESIGN,"

Application Ser. No. 60/726,150, filed on Oct. 12, 2005 by Kesse Ho, entitled "KA LNB UMBRELLA SHADE,"

Application Ser. No. 60/726,151, filed on Oct. 12, 2005 by John L. Norin and Kesse Ho, entitled "BAND UPCONVERTER APPROACH TO KA/KU SIGNAL DISTRIBUTION,"

Application Ser. No. 60/727,143, filed on Oct. 14, 2005 by John L. Norin and Kesse Ho, entitled "BAND UPCONVERTER APPROACH TO KA/KU SIGNAL DISTRIBUTION,"

Application Ser. No. 60/726,338, filed on Oct. 12, 2005 by John L. Norin, Kesse Ho, Mike A. Frye, and Gustave Stroes, entitled "NOVEL ALIGNMENT METHOD FOR MULTI-SATELLITE CONSUMER RECEIVE ANTENNAS,"

Application Ser. No. 60/754,737, filed on Dec. 28, 2005 by John L. Norin, entitled "KA/KU ANTENNA ALIGNMENT,"

Application Ser. No. 60/758,762, filed on Jan. 13, 2006 by Kesse Ho, entitled "KA LNB UMBRELLA SHADE,"and Application Ser. No. 60/726,337, filed Oct. 12, 2005, entitled "ENHANCED BACK ASSEMBLY FOR KA/KU ODU," by Michael A. Frye et al., all of which applications are incorporated by reference herein.

BACKGROUND OF THE INVENTION

1. Field of the Invention

The present invention relates generally to a satellite receiver system, and in particular, to an antenna assembly for such a satellite receiver system.

2. Description of the Related Art

Satellite broadcasting of communications signals has become commonplace. Satellite distribution of commercial signals for use in television programming currently utilizes multiple feedhorns on a single Outdoor Unit (ODU) which supply signals to up to eight IRDs on separate cables from a multiswitch.

Figure 1:
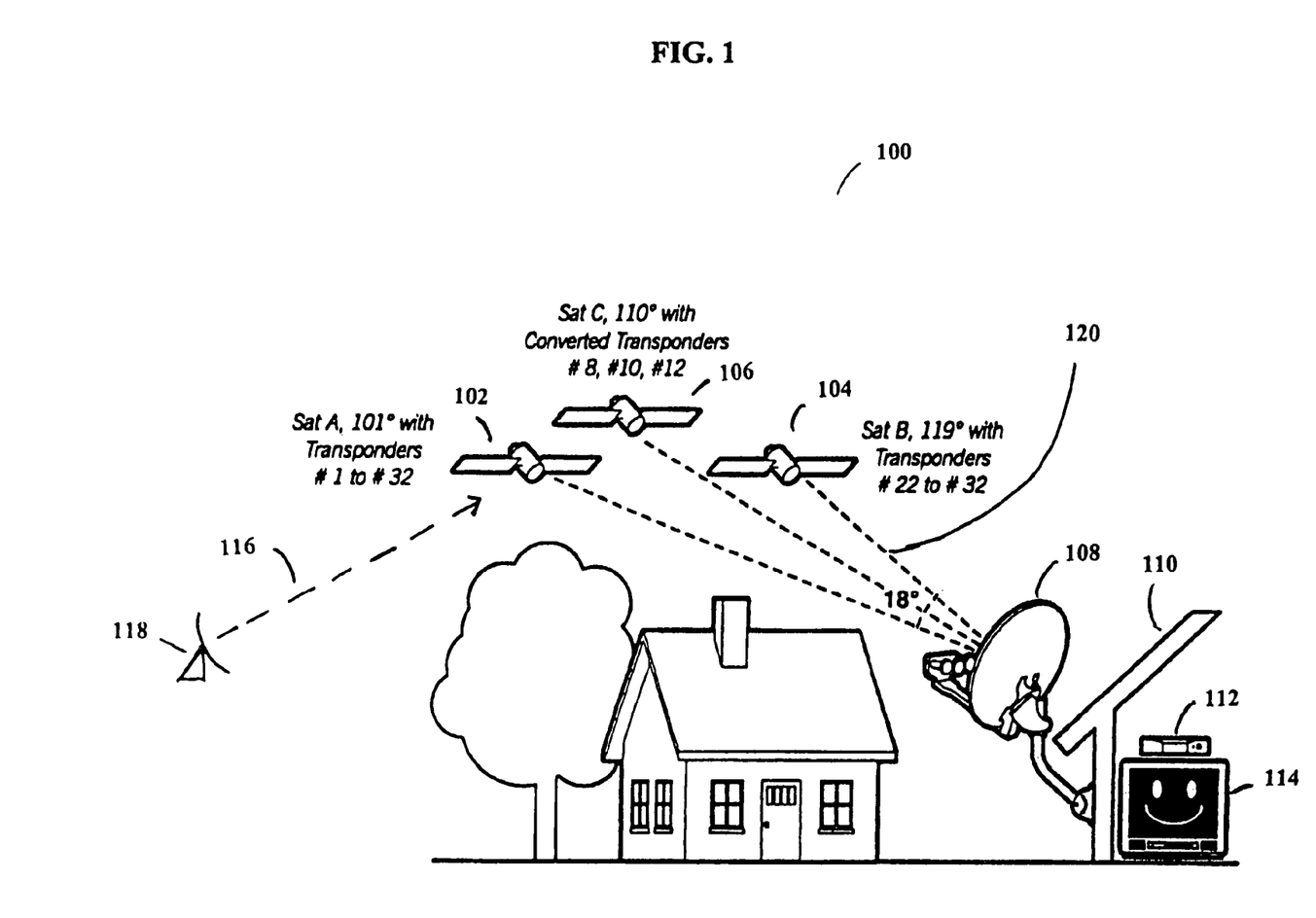
FIG. 1 illustrates a typical satellite television installation of the related art.

FIG. 1 illustrates a typical satellite television installation of the related art.

System 100 uses signals sent from Satellite A (SatA) 102, Satellite B (SatB) 104, and Satellite C (SatC) 106 (with transponders 28, 30, and 32 converted to transponders 8, 10, and 12, respectively), that are directly broadcast to an Outdoor Unit (ODU) 108 that is typically attached to the outside of a house 110. ODU 108 receives these signals and sends the received signals to IRD 112, which decodes the signals and separates the signals into viewer channels, which are then passed to television 114 for viewing by a user. There can be more than one satellite transmitting from each orbital location.

Satellite uplink signals 116 are transmitted by one or more uplink facilities 118 to the satellites 102-106 that are typically in geosynchronous orbit. Satellites 102-106 amplify and rebroadcast the uplink signals 116, through transponders located on the satellite, as downlink signals 120. Depending on the satellite 102-106 antenna pattern, the downlink signals 120 are directed towards geographic areas for reception by the ODU 108.

Each satellite 102-106 broadcasts downlink signals 120 in typically thirty-two (32) different sets of frequencies, often referred to as transponder frequencies, which frequencies are licensed to various users for broadcasting of programming, which can be audio, video, or data signals, or any combination. These signals have typically been located in the Ku-band Fixed Satellite Service (FSS) and Broadcast Satellite Service (BSS) bands of frequencies in the 10-13 GHz range. Future satellites will likely also broadcast in a portion of the Ka-band with frequencies of 18-21 GHz.

Figure 2:
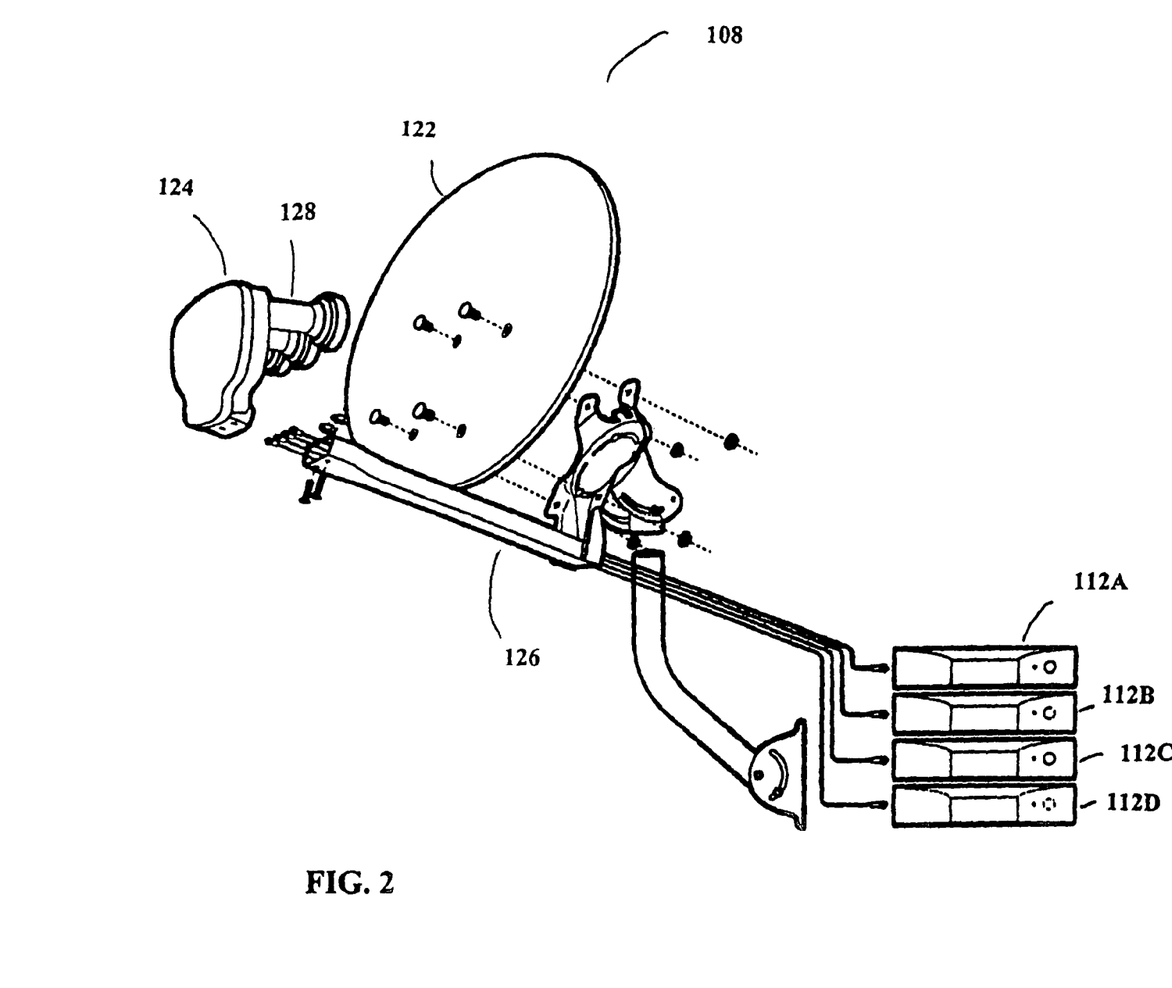
FIG. 2 illustrates a typical ODU of the related art.

FIG. 2 illustrates a typical ODU of the related art.

ODU 108 typically uses reflector dish 122 and feedhorn assembly 124 to receive and direct downlink signals 120 onto feedhorn assembly 124. Reflector dish 122 and feedhorn assembly 124 are typically mounted on bracket 126 and attached to a structure for stable mounting. Feedhorn assembly 124 typically comprises one or more Low Noise Block converters 128, which are connected via wires or coaxial cables to a multiswitch, which can be located within feedhorn assembly 124, elsewhere on the ODU 108, or within house 110. LNBs typically downconvert the FSS and/or BSS-band, Ku-band, and Ka-band downlink signals 120 into frequencies that are easily transmitted by wire or cable, which are typically in the L-band of frequencies, which typically ranges from 950 MHz to 2150 MHz. This downconversion makes it possible to distribute the signals within a home using standard coaxial cables.

The multiswitch enables system 100 to selectively switch the signals from SatA 102, SatB 104, and SatC 106, and deliver these signals via cables 124 to each of the IRDs 112A-D located within house 110. Typically, the multiswitch is a five-input, four-output (5×4) multiswitch, where two inputs to the multiswitch are from SatA 102, one input to the multiswitch is from SatB 104, and one input to the multi-switch is a combined input from SatB 104 and SatC 106. There can be other inputs for other purposes, e.g., off-air or other antenna inputs, without departing from the scope of the present invention. The multiswitch can be other sizes, such as a 6×8 multiswitch, if desired. SatB 104 typically delivers local programming to specified geographic areas, but can also deliver other programming as desired.

To maximize the available bandwidth in the Ku-band of downlink signals 120, each broadcast frequency is further divided into polarizations. Each LNB 128 can receive both orthogonal polarizations at the same time with parallel sets of electronics, so with the use of either an integrated or external multiswtich, downlink signals 120 can be selectively filtered out from travelling through the system 100 to each IRD 112A-D.

IRDs 112A-D currently use a one-way communications system to control the multiswitch. Each IRD 112A-D has a dedicated cable 124 connected directly to the multiswitch, and each IRD independently places a voltage and signal combination on the dedicated cable to program the multiswitch. For example, IRD 112A may wish to view a signal that is provided by SatA 102. To receive that signal, IRD 112A sends a voltage/tone signal on the dedicated cable back to the multiswitch, and the multiswitch delivers the sata 102 signal to IRD 112A on dedicated cable 124. IRD 112B independently controls the output port that IRD 112B is coupled to, and thus may deliver a different voltage/tone signal to the multiswitch. The voltage/tone signal typically comprises a 13 Volts DC (VDC) or 18 VDC signal, with or without a 22 kHz tone superimposed on the DC signal. 13VDC without the 22 kHz tone would select one port, 13 VDC with the 22 kHz tone would select another port of the multiswitch, etc. There can also be a modulated tone, typically a 22 kHz tone, where the modulation schema can select one of any number of inputs based on the modulation scheme. For simplicity and cost savings, this control system has been used with the constraint of 4 cables coming for a single feedhorn assembly 124, which therefore only requires the 4 possible state combinations of tone/no-tone and hi/low voltage.

To reduce the cost of the ODU 108, outputs of the LNBs 128 present in the ODU 108 can be combined, or "stacked," depending on the ODU 108 design. The stacking of the LNB 128 outputs occurs after the LNB has received and downconverted the input signal. This allows for multiple polarizations, one from each satellite 102-106, to pass through each LNB 128. So one LNB 128 can, for example, receive the Left Hand Circular Polarization (LHCP) signals from SatC 102 and SatB 104, while another LNB receives the Right Hand Circular Polarization (RHCP) signals from SatB 104, which allows for fewer wires or cables between the feedhorn assembly 124 and the multiswitch.

The Ka-band of downlink signals 120 will be further divided into two bands, an upper band of frequencies called the "A" band and a lower band of frequencies called the "B" band. Once satellites are deployed within system 100 to broadcast these frequencies, the various LNBs 128 in the feedhorn assembly 124 can deliver the signals from the Ku-band, the A band Ka-band, and the B band Ka-band signals for a given polarization to the multiswitch. However, current IRD 112 and system 100 designs cannot tune across this entire resulting frequency band without the use of more than 4 cables, which limits the usefulness of this frequency combining feature.

By stacking the LNB 128 inputs as described above, each LNB 128 typically delivers 48 transponders of information to the multiswitch, but some LNBs 128 can deliver more or less in blocks of various size. The multiswitch allows each output of the multiswitch to receive every LNB 128 signal (which is an input to the multiswitch) without filtering or modifying that information, which allows for each IRD 112 to receive more data. However, as mentioned above, current IRDs 112 cannot use the information in some of the proposed frequencies used for downlink signals 120, thus rendering useless the information transmitted in those downlink signals 120.

It can be seen, then, that there is a need in the art for a satellite broadcast system that can be expanded to include new satellites and new transmission frequencies.

SUMMARY OF THE INVENTION

To minimize the limitations in the prior art, and to minimize other limitations that will become apparent upon reading and understanding the present specification, the present invention discloses a method, apparatus and system for selectively stacking signals in a satellite delivery system. A system in accordance with the present invention comprises a first set of satellite signals broadcast in a first frequency band, wherein the first set of satellite signals is downconverted to a first intermediate frequency (IF) band of signals, a second set of satellite signals broadcast in a second frequency band, wherein the second set of satellite signals is downconverted to a second IF band of signals and a third IF band of signals, wherein the first IF band of signals, the second IF band of signals, and the third IF band of signals are present in a combined IF signal on a cable, an upconverter, comprising a splitter, coupled to the cable, for dividing the combined IF signal, a first path, coupled to a first output of the splitter, for selectively passing the combined IF signal to an output of the upconverter, a second path, coupled to a second output of the splitter, for removing the first IF band of signals from the combined IF signal and for upconverting the first IF band of signals to the third IF band of signals, a third path, coupled to the first output of the splitter, for selectively removing the third IF band of signals from the combined IF signal and subsequently diplexing the upconverted first IF band of signals with a remainder of the combined IF signal into a diplexed signal, the diplexed signal selectively delivered to the output of the upconverter, and a receiver, coupled to the upconverter, wherein the selection of the combined IF signal and the diplexed signal is made by the receiver.

Other features and advantages are inherent in the system and method claimed and disclosed or will become apparent to those skilled in the art from the following detailed description and its accompanying drawings.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which show, by way of illustration, several embodiments of the present invention. It is understood that other embodiments may be utilized and structural changes may be made without departing from the scope of the present invention.

Overview

Currently, there are three orbital slots, each comprising one or more satellites, delivering direct-broadcast television programming signals to the various ODUs 108. However, ground systems that currently receive these signals cannot accommodate additional satellite signals without adding more cables, and cannot process the additional signals that will be used to transmit the growing complement of high-definition television (HDTV) signals. The HDTV signals can be broadcast from the existing satellite constellation, or broadcast from the additional satellite(s) that will be placed in geosynchronous orbit. The orbital locations of the Ku-BSS satellites are fixed by regulation as being separated by nine degrees, so, for example, there is a satellite at 101 degrees West Longitude (WL), SatA 102; another satellite at 110 degrees WL, SatC 106; and another satellite at 119 degrees WL, SatB 104. Additional satellites may be at other orbital slots, e.g., 72.5 degrees, 95, degrees, 99 degrees, and 103 degrees, and other orbital slots, without departing from the scope of the present invention. The satellites are typically referred to by their orbital location, e.g., SatA 102, the satellite at 101 WL, is typically referred to as "101." Additional orbital slots, with one or more satellites per slot, are presently contemplated at 99 and 103 (99.2 degrees West Longitude and 102.8 degrees West Longitude, respectively).

The present invention allows currently installed systems to continue receiving currently broadcast satellite signals, as well as allowing for expansion of additional signal reception and usage.

Multiswitch Port Selection

As described above, typically, the ports of a multiswitch are selected by the IRD 112 sending a DC voltage signal with or without a tone superimposed on the DC voltage signal to select a satellite 102-106. For example, and not by way of limitation, FOX News Channel may be located on transponder 22 from SatB 104. SatB 104 is typically selected by IRD 112 by sending an 18V signal with a 22 kHz tone superimposed on the 18V signal to the multiswitch, which then selects the downlink signal 120 coming from SatB 104. Additional processing is then done on signal 120 within IRD 112 to find the individual channel information associated with FOX News Channel, which is then displayed on monitor 114.

However, when new satellites 102-106 are operational, and additional signals as well as additional frequency bands become available, the currently distributed IRDs 112 must still operate, and new IRDs 112 capable of receiving, demodulating, and forwarding these new downlink signals 120 must also be able to perform these operations on existing and new signals.

The Ka-band of downlink signals 120 is divided into two RF (radio frequency) sub-bands and corresponding Intermediate Frequency (IF) sub-bands, an upper band of frequencies called the "A" band and a lower band of frequencies called the "B" band. Once satellites are deployed within system 100 to broadcast these frequencies, each assembly 124 can deliver the signals from the Ku-band, the A band Ka-band, and the B band Ka-band signals for a given polarization to the integrated or external multiswitch.

By stacking the LNB 128 inputs as described above, each LNB 128 typically delivers 48 transponders of information to the multiswitch, but some LNBs 128 can deliver more or less in blocks of various size. The multiswitch allows each output of the multiswitch to receive every LNB 128 signal (which is an input to the multiswitch) without filtering or modifying that information, which allows for each IRD 112 to receive more data.

New IRDs 112 can use the information in some of the proposed frequencies used for downlink signals 120, and thus the information transmitted in those downlink signals 120 will be available to viewers as separate viewer channels.

Rather than assign new satellite selection codes to the new satellites 102-106, which can be done by using different DC voltages and/or different tones, either alone or in combination, the present invention stacks the signals to allow both legacy (older) IRDs 112 and new IRDs 112 to receive the current downlink signals 120 using the already-known selection criteria (13/18 VDC, with or without 22 kHz tones), and for the new IRDs 112 that can receive and demodulate the new satellite downlink signals 120, those same codes will access the new satellite downlink signals 120, because those signals will be intelligently stacked on top of the current downlink signals 120.

ODU Design and Stacking Plan

In the present invention, the design of the Ka/Ku ODU using the newly-assigned Ka frequency bands (18.3 GHz-18.8 GHz; 19.7 GHz-20.2 GHz), incorporates the current design of millions of Ku (12.2 GHz-12.7 GHz) satellite receivers that are currently distributed to satellite television viewers. The present invention downconverts the Ka-band signals and the Ku-band signals to specific IF signal bands, and selectively combines them to enable the reception of both the Ka and the Ku signals using the traditional satellite selection topology of 13V, 18V, 13V/22KHz and 18V/22 KHz.

Figure 3:
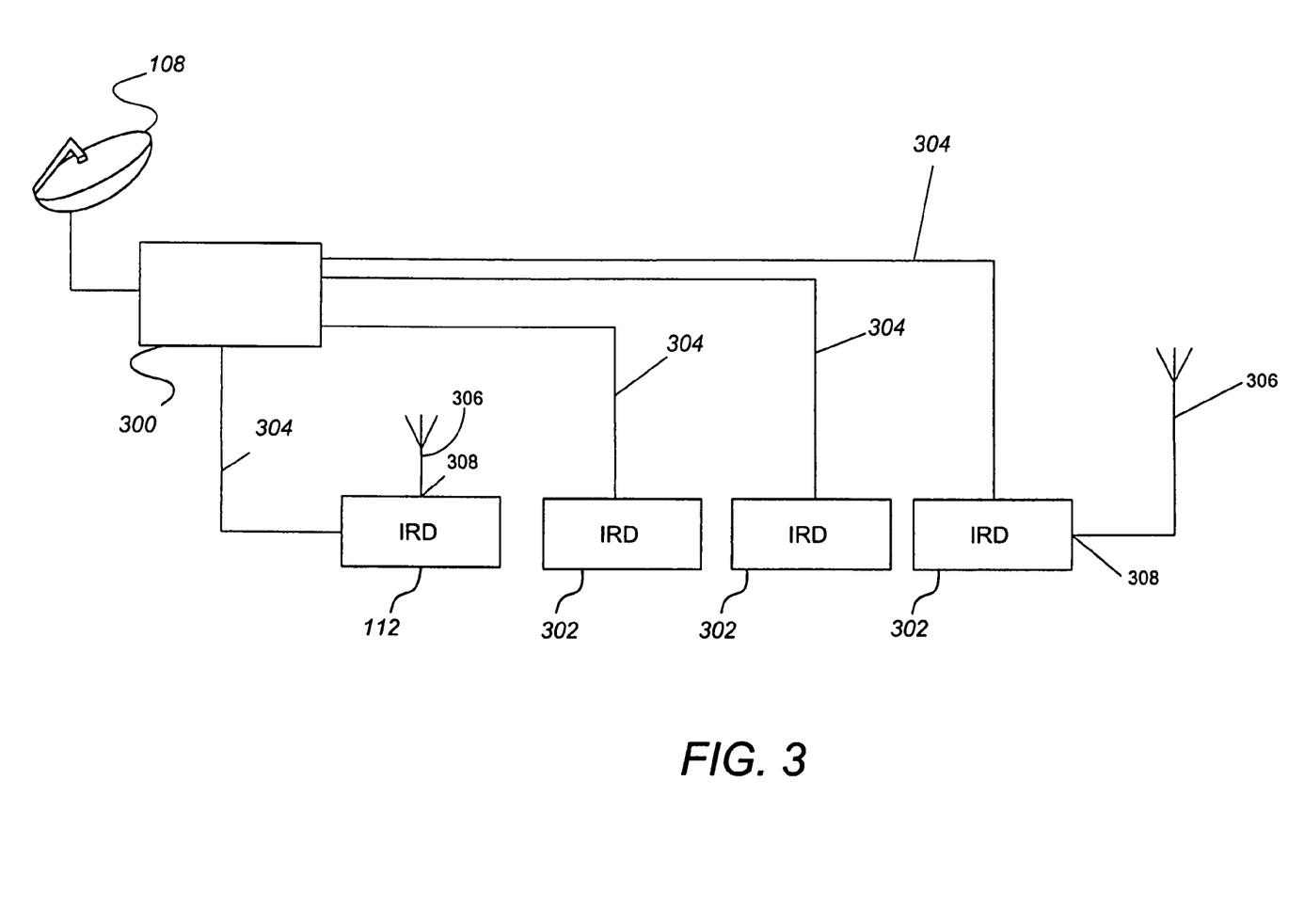
FIG. 3 illustrates a system diagram of the present invention.

FIG. 3 illustrates a system diagram of the present invention.

ODU 108 is coupled to distribution system 300, which is coupled to IRD 112 and new IRDs 302 via cables 304. Each of cables 304 carries commands from IRDs 112 and 302 back to distribution system 300, and also carries signals 120 that are received by ODU 108 and stacked by distribution system 300 in accordance with the present invention.

IRD 112, also referred to as a legacy RD 112 or a currently deployed IRD 112, is only capable of demodulating signals in the 950-1450 MHz band, because the receiver located in IRD 112 is designed for that frequency band. However, IRD 302 can receive signals over the range of 950-2150 MHz. The 1650-2150 MHz band is usually referred to as the "A-band" or "Ka-high band" IF, while the 250-750 MHz band is referred to as the "B-band" or "Ka-low band" IF, as these bands are populated with downlink signals 120 that have been downconverted from the Ka-band. The 950-1450 MHz band is downconverted from the Ku-band of downlink signals 120. Additional functionality in distribution system 300 or in RD 302 can shift the Ka-low IF to the Ka-high IF as needed by the IRD. Further, IRD 302 may be able to receive Ka-low IF frequencies with additional electronics either between ODU 108, as part of IRD 302, or other methods.

IRDs 112 and 302 also have the ability to connect antenna 306 to port 308, where off-air television signals can be coupled to IRD 112 and/or 302 can be processed by IRDs 112 and 302.

Figure 4:
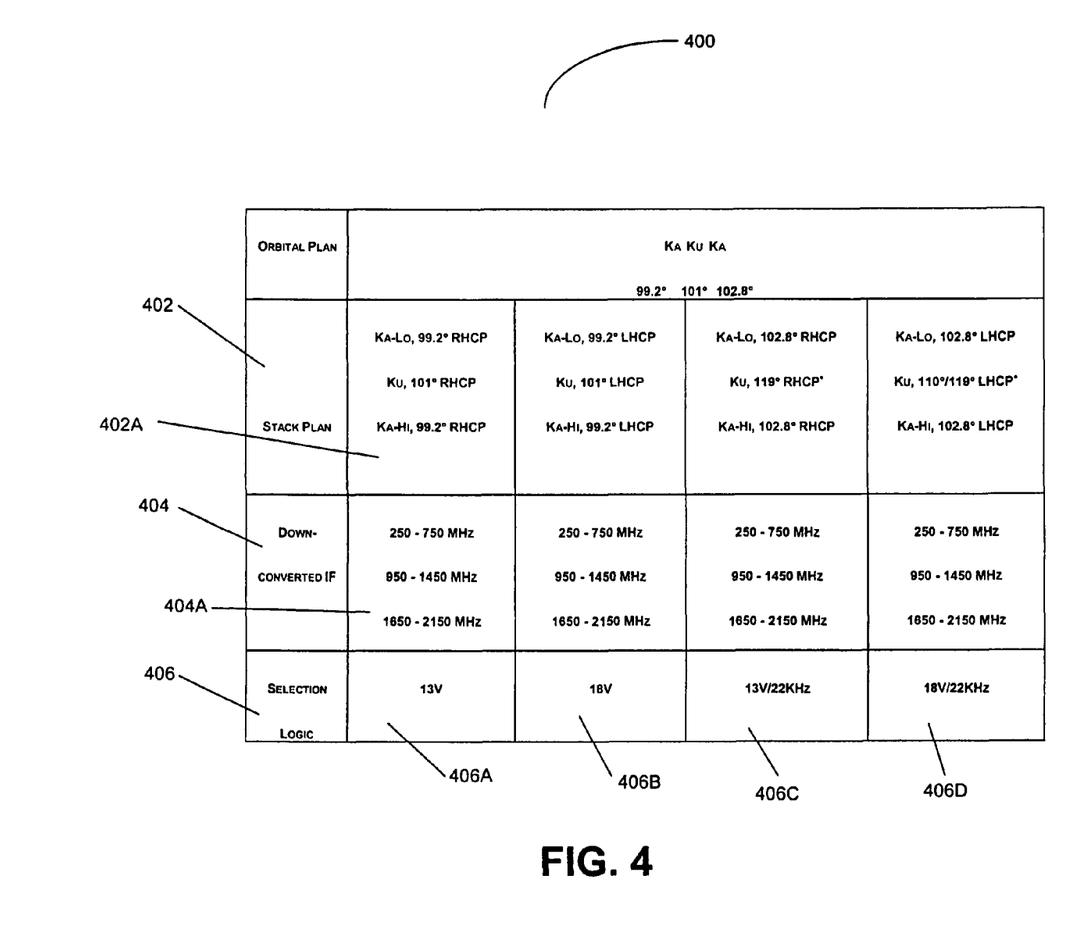
FIG. 4 illustrates the stack plan in accordance with the present invention.

FIG. 4 illustrates the stack plan in accordance with the present invention.

Orbital plan 400 illustrates the stack plan 402, downconverted IF frequencies 404, and selection logic 406 for system 100 which includes satellites 102-106 as well as additional satellites operating at additional orbital slots and at additional frequencies. For example, and not by way of limitation, FIG. 4 illustrates orbital plan 400 comprising new satellites at 99.2 degrees West Longitude and at 102.8 degrees West Longitude, and broadcasting at the Ka-band of frequencies. However, other orbital slots, and other frequency bands, are possible within the scope of the present invention.

Selection logic 406 indicates how each IRD 112 and 302 select signals from a given grouping of satellites 102-106 as determined by the stack plan 402 and downcoverted IF 404. The legacy RD 112 can only receive signals in the 950-1450 MHz range, which corresponds to satellites 102-106. For example, and not by way of limitation, if RD 112 sends a 13V signal to the multiswitch resident in ODU 108, shown in box 406A, then the multiswitch will select a specific port, namely, the port that contains the signals from the satellites designated by stack plan 402A, which are downconverted to signals based on downconverted IF 404A. So, as shown in box 402A, the Right-Hand Circular Polarized (RHCP) signals from a Ka-band downlink signal 120 transmitted by a satellite 102-

106 resident at 99.2 degrees West Longitude will be selected, as will the RHCP Ku-band downlink signal 120 transmitted by satellite 102 resident at 101 degrees West Longitude.

The Ku-band downlink signal 120 will be downconverted into the 950-1450 MHz band as shown in downconverted IF 404A, however, the Ka-band downlink signal 120 will be downcoverted into two different frequency bands. This differentiation can be done based on a number of factors, e.g., it may be desirable to restrict access to either the A-band (1650-2150 MHz) or the B-band (250-750 MHz) for viewer programming choices. So, a system 100 operator may wish to put pay-per-view downlink signals 120 onto the A-band, which would require a viewer to call into the system 100 operator for activation of that service. Other reasons for placing a given downlink signal 120 into either the A-band or B-band are contemplated within the scope of the present invention.

The entire set of RHCP Ka-band signals transmitted from 99.2 degrees can now be selected by sending a selection logic 406A signal of 13V. Similarly, the entire set of Left Hand Circularly Polarized (LHCP) Ka-band signals transmitted from 99.2 degrees can now be selected by sending a selection logic 406B signal of 18V, the entire set of RHCP Ka-band signals transmitted from 102.8 degrees can now be selected by sending a selection logic 406C signal of 13V with a 22 kHz tone superimposed, and the entire set of LHCP Ka-band signals transmitted from 102.8 degrees can now be selected by sending a selection logic 406D signal of 18V with a 22 kHz tone superimposed. Since these are the same selection signals used for current satellites 102-106, legacy IRDs 112 can still be mated with new ODUs 108 which can receive and downconvert Ka-band signals without reprogramming or decommissioning IRDs 112, while new IRDs 302 can receive all of the downconverted signals transmitted by satellites 102-106 and any new satellites.

So, a house 110 can have both legacy IRDs 112 and new IRDs 302 coupled to an ODU 108 of any vintage. Older ODUs that can only receive Ku-band signals 120 will still flow through to all IRDs 112 as in previous systems 100, and new IRDs 302 will be able to receive the Ku-band signals 120 as well. As a customer upgrades their ODU 108 to one that can receive and downconvert Ka-band signals 120 from new satellites (resident at 99.2 and 102.8, and elsewhere), existing IRDs 112 can still properly select Ku-band signals 120 as before, while new IRDs 302 can select not only the Ku-band signals 120, but the Ka-band signals 120, without any change in selection logic. Viewers can then choose which room in their house 110 to place legacy IRDs 112 and new IRDs 302 without the need for special hardware or other installation requirements.

Typically, IRDs 112 and IRD 302 receivers operate in the 950-2150 MHz region, and can therefore receive signals in that frequency range. To receive the B-band signals that are resident in the 250-750 MHz region, broadband receivers must be employed by IRD 112 and/or IRD 302, which increases the cost of such devices. Further, linearity in reception over such a broad band of frequencies is very difficult to achieve, and, as such, it is desirable to be able to have a narrower band receiver.

Frequency Band Upconversion

Figure 5:
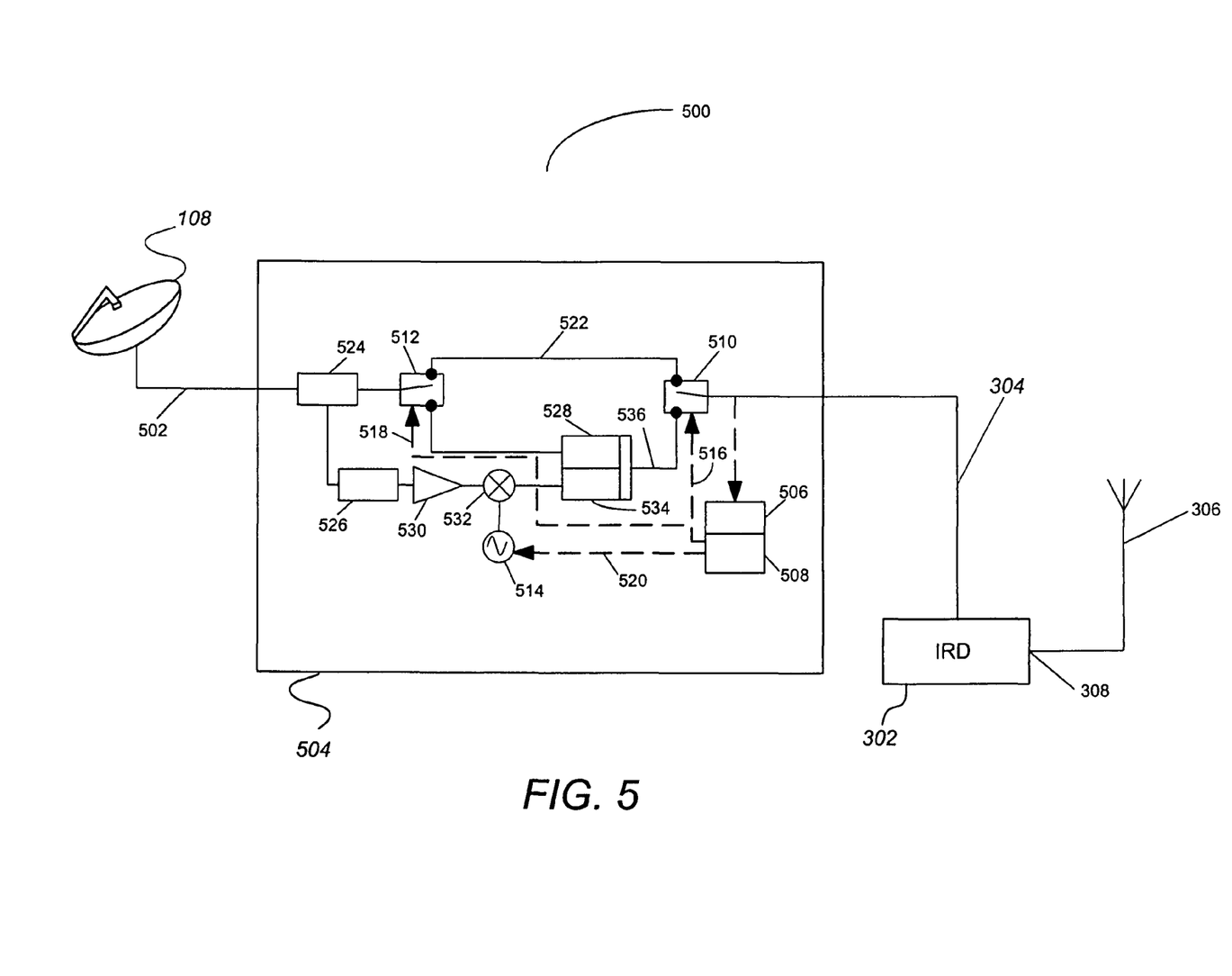
FIG. 5 illustrates a frequency band upconversion schema in accordance with the present invention.

FIG. 5 illustrates a frequency band upconversion schema in accordance with the present invention.

System 500 shows ODU 108, connected by cable 502 to upconverter 504, which is then connected to IRD 302 via cable 304. Upconverter 504 can be connected directly to IRD 302 or directly to ODU 108 if desired without departing from the scope of the present invention.

Upconverter 504 receives commands from IRD 302 as well as signals from ODU 108. Cable 502 passes a 250-2150 MHz signal as described above to upconverter 504. Similarly, IRD 302 sends the 13/18 VDC and/or 22 kHz tone signals to ODU 108 through upconverter 504 to select which satellite 102-106 signal that IRD 302 needs to present a desired viewer channel to a viewer.

Commands from IRD to ODU

Within upconverter 504, the command path from IRD 302 to ODU 108 is as follows. Commands are sent via cable 304 to upconverter 504, and received by receiver 506. Reciever 506 is typically a DiSEqC receiver, but can be other receivers for other command schema without departing from the scope of the present invention. Receiver 506 sends commands to controller 508, which controls switches 510 and 512 as well as Local Oscillator (LO) 514. The command flow is shown as dashed lines 516-520 between controller 508 and switches 510-512 and LO 514, respectively. Commands from IRD 302 are then passed through switches 510 and 512, via path 522, through coupler 524, to cable 502 and ODU 108. Since switches 512 and 514 are DC-passing switches, switches 512 and 514 will pass the relatively low-frequency (22 kHz) tone and DC commands regardless of position. When switches 510 and 522 are in the lower positions, the DC commands pass through diplexer 528 and on to coupler 524 and ODU 108.

RF Signals from ODU to IRD

The RF path from ODU 108 to IRD 304 is as follows. A 250-2150 MHz spectrum signal is passed from ODU 108 through cable 502 to coupler 524. RF energy is passed to switch 512 as well as filter 526. Filter 526 is a low-pass filter, typically with a 0.8 GHz cutoff frequency, such that the B-band (250-750 MHz) signal resident on the signal coming from ODU 108 will be routed through filter 526.

The signal that is routed to switch 512 passes through switch 512 and is selectively routed to diplexer input 528 or routed directly through to switch 510, depending on the positions of the wipers of switch 512. When switch 512 is in the upper position, the signal on cable 502 is passed directly through to IRD 302, via switch 512, path 522, and switch 510 (which would also be in the upper position). Switches 510 and 512 can be separate Single-Pole, Double Throw (SPDT) switches as shown, or can be a Double-Pole, Double Throw (DPDT) switch if desired.

However, when switch 512 is in the lower position, the signal from ODU 108 is sent to diplexer input 528, which has a 1.5 GHz cutoff frequency. Diplexer input 528 thus removes the A band (1650-2150 MHz) signals present in the signal from ODU 108.

However, once the B band signals are filtered through filter 526, and optionally amplified by amplifier 530, they are mixed at mixer 532 with the LO 514 frequency, which is typically 1400 MHz. This mixing process upconverts the B-band signals from a 250-750 MHz band to a 1650-2150 MHz band (using the RF sum of the LO 514 and the output of amplifier 530). This upconverted B-band signal is then input to diplexer input 534, which has a high-pass finter of 1.6 GHz, allowing the upconverted B-band to be diplexed with the signal where the A-band signal was removed (by diplexer input 528).

As such, the signal present on path 536 has a signal present from 250-750 MHz, and the same signal, upconverted to 1650-2150 MHz, along with a second signal present in the 950-1450 MHz region. This allows for selective movement of the B-band signal from the low frequencies (250-750 MHz) to the upper frequencies (1650-2150 MHz) such that a narrower band receiver present in IRD 302 can present these viewer channels without redesign and/or other modification.

So, for example, and not by way of limitation, the signals present on cable 502 when IRD 302 sends a 13V selection logic 406A command to IRD 502 are the Ka-low band RHCP signals from the satellite the Ku-band RHCP signals from the satellite at 101 degrees, and the KA-high band RHCP signals from the satellite at 99.2 degrees. If a viewer wishes to see a viewer channel that is present in the Ka-high band RHCP signals, controller 508 leaves switches 510 and 512 in the upper position, which allows RF energy from ODU 108 to travel path 522 directly to IRD 302 through upconverter 504. IRD 302 can have a 950-2150 MHz receiver, and since the Ka-high band signals are downconverted to 1650-2150 MHz, the receiver in IRD 302 can receive these signals for further demodulation and/or processing, such that the data in the signal can be shown to the viewer as expected. Although RF energy is also going to filter 526, it is not incorporated into any signal on cable 304, because there is no connecting path when switch 510 is in the upper position.

However, if the viewer selects a viewer channel that is present in the Ka-low band signals, without a broadband receiver that can receive the 250-750 MHz signals, the upconverter 504 of the present invention recognizes the command via receiver 506 that a viewer channel in the Ka-low band has been selected, and moves the wipers on switches 512 and 510 to the lower position. The signal on cable 502 is still sent through filter 526, where the Ka-low band is passed and the remainder of the signal on cable 502 is filtered away. The signal is also sent, in parallel, through diplexer input 528, where the Ka-high band is filtered away, leaving the Ka-low band and the Ku-band signals in place. When the Ka-low band is mixed at mixer 532, it is upconverted to the same frequency domain that the Ka-high band occupied, and after being diplexed via diplexer input 534, is now part of the signal that will be passed to IRD 302 via switch 510 in the lower position. As long as the mapping between the IRD 302 and receiver 506 is accurate, the IRD 302 will look for the desired viewer channel, which was in the B band of IF frequencies, in the A band of IF frequencies at the same relative position. So, a signal that was expected at 250 MHz will now be at 1650 MHz, etc. The tuning commands for the shifted B-band signals are easily stored in a lookup table in the IRD 302, or in other memory as needed or desired.

The upconverter 504 of the present invention can leave switches 510 and 512 in the lower position (such that path 536 continues to be used and the B-band Ka-band downcovnerted signals remain in the upper frequency band) until the viewer selects a viewer channel that is known to be in the A-band of signals, and, when such an event occurs, switches 510 and 512 return to the upper position. The selection of whether path 522 or path 536 is used is based on commands from the IRD 302.

Compatibility with Off-Air Signals

As shown in FIGS. 4 and 5, some of the signals 502-516 will be resident, after downconversion, in the 250-750 MHz band of frequencies, which is normally occupied by the off-air UHF/VHF broadcast channels (which are resident in the 54 MHz-860 MHz frequencies). The UHF/VHF band can still be realized at IRDs 112 and 302 by diplexing or can connect to the "VHF/UHF Antenna In" input on the IRDs 112/302 directly.

CONCLUSION

In summary, the present invention comprises a method, apparatus and system for stacking signals in a satellite delivery system. A system in accordance with the present invention comprises a first set of satellite signals broadcast in a first frequency band, wherein the first set of satellite signals is downconverted to a first intermediate frequency (IF) band of signals, a second set of satellite signals broadcast in a second frequency band, wherein the second set of satellite signals is downconverted to a second IF band of signals and a third IF band of signals, wherein the first IF band of signals, the second IF band of signals, and the third IF band of signals are present in a combined IF signal on a cable, an upconverter, comprising a splitter, coupled to the cable, for dividing the combined IF signal, a first path, coupled to a first output of the splitter, for selectively passing the combined IF signal to an output of the upconverter, a second path, coupled to a second output of the splitter, for removing the first IF band of signals from the combined IF signal and for upconverting the first IF band of signals to the third IF band of signals, a third path, coupled to the first output of the splitter, for selectively removing the third IF band of signals from the combined IF signal and subsequently diplexing the upconverted first IF band of signals with a remainder of the combined IF signal into a diplexed signal, the diplexed signal selectively delivered to the output of the upconverter, and a receiver, coupled to the upconverter, wherein the selection of the combined IF signal and the diplexed signal is made by the receiver.

It is intended that the scope of the invention be limited not by this detailed description, but rather by the claims appended hereto and the equivalents thereof. The above specification, examples and data provide a complete description of the manufacture and use of the composition of the invention. Since many embodiments of the invention can be made without departing from the spirit and scope of the invention, the invention resides in the claims hereinafter appended and the equivalents thereof.

What is claimed is:

1. A system for delivering satellite signals, comprising:
  a first set of satellite signals broadcast in a first frequency band, wherein the first set of satellite signals is downconverted to a first intermediate frequency (IF) band of signals;
  a second set of satellite signals broadcast in a second frequency band, wherein the second set of satellite signals is downconverted to a second IF band of signals and a third IF band of signals, wherein the first IF band of signals, the second IF band of signals, and the third IF band of signals are present in a combined IF signal on a cable; and
  an upconverter, comprising:
    a splitter, coupled to the cable, for dividing the combined IF signal;
    a first path, coupled to a first output of the splitter, for selectively passing the combined IF signal to an output of the upconverter;
    a second path, coupled to a second output of the splitter, for removing the first IF band of signals from the combined IF signal and for upconverting the first IF band of signals to the third IF band of signals; and
    a third path, coupled to the first output of the splitter, for selectively removing the third IF band of signals from the combined IF signal and subsequently diplexing the upconverted first IF band of signals with a remainder of the combined IF signal into a diplexed signal, the diplexed signal selectively delivered to the output of the upconverter.

2. The system of claim 1, wherein a receiver coupled to the upconverter cannot process at least the second IF band of signals.

3. The system of claim 2, further comprising a second receiver, coupled to the upconverter, wherein the second receiver processes the entire combined IF signal.

4. The system of claim 1, wherein the first frequency band is a Ku-band of frequencies.

5. The system of claim 1, wherein the second frequency band is a Ka-band of frequencies.

6. The system of claim 2, wherein the receiver can further process off-air television signals.

7. The system of claim 6, wherein the combined IF signal and the off-air television signals have overlapping frequencies.

8. A system for delivering satellite signals to a receiver, comprising:
- a plurality of satellites, wherein at least a first satellite in the plurality of satellites broadcasts a first set of satellite signals broadcast in a first frequency band, and at least a second satellite in the plurality of satellites broadcasts a second set of satellite signals in a second frequency band;
- an antenna, the antenna receiving the first set of satellite signals and the second set of satellite signals;
- a downconverter, coupled to the antenna, wherein the downconverter downconverts the first set of satellite signals to a first intermediate frequency (IF) band of signals and downconverts the second set of satellite signals to a second IF band of signals and a third IF band of signals, wherein the first IF band of signals, the second IF band of signals, and the third IF band of signals are present in a combined IF signal on a cable; and
- an upconverter, comprising:
  - a splitter, coupled to the cable, for dividing the combined IF signal;
  - a first path, coupled to a first output of the splitter, for selectively passing the combined IF signal to an output of the upconverter;
  - a second path, coupled to a second output of the splitter, for removing the first IF band of signals from the combined IF signal and for upconverting the first IF band of signals to the third IF band of signals; and
  - a third path, coupled to the first output of the splitter, for selectively removing the third IF band of signals from the combined IF signal and subsequently diplexing the upconverted first IF band of signals with a remainder of the combined IF signal into a diplexed signal, the diplexed signal selectively delivered to the output of the upconverter.

9. The system of claim 8, wherein a receiver coupled to an output of the upconverter cannot process at least the second IF band of signals.

10. The system of claim 9, further comprising a second receiver, coupled to the upconverter, wherein the second receiver processes the entire combined IF signal.

11. The system of claim 8, wherein the first frequency band is a Ku-band of frequencies.

12. The system of claim 8, wherein the second frequency band is a Ka-band of frequencies.

13. The system of claim 12, wherein the receiver can further process off-air television signals.

14. The system of claim 13, wherein the combined IF signal and the off-air television signals have overlapping frequencies.

15. A system for delivering satellite signals to a receiver, comprising:
- a plurality of satellites, wherein at least a first satellite in the plurality of satellites broadcasts a first set of satellite signals broadcast in a first frequency band, and at least a second satellite in the plurality of satellites broadcasts a second set of satellite signals in a second frequency band;
- an antenna, the antenna receiving the first set of satellite signals and the second set of satellite signals;
- a downconverter, coupled to the antenna, wherein the downconverter downconverts the first set of satellite signals to a first intermediate frequency (IF) band of signals and downconverts the second set of satellite signals to a second IF band of signals and a third IF band of signals, wherein the first IF band of signals, the second IF band of signals, and the third IF band of signals are present in a combined IF signal on a cable; and
- an upconverter, comprising:
  - a splitter, coupled to the cable, for dividing the combined IF signal;
  - a first path, coupled to a first output of the splitter, for selectively passing the combined IF signal to an output of the upconverter;
  - a second path, coupled to a second output of the splitter, for removing the first IF band of signals from the combined IF signal and for upconverting the first IF band of signals to the third IF band of signals; and
  - a third path, coupled to the first output of the splitter, for selectively removing the third IF band of signals from the combined IF signal and subsequently diplexing the upconverted first IF band of signals with a remainder of the combined IF signal into a diplexed signal, the diplexed signal selectively delivered to the output of the upconverter.

16. The system of claim 15, further comprising at least a first receiver and a second receiver, the first receiver coupled to a first output of the plurality of outputs and the second receiver coupled to a second output of the plurality of outputs, wherein the second receiver processes the entire combined IF signal and the first receiver processes at least the first intermediate band and the second intermediate band of the combined IF signal.

17. The system of claim 16, wherein the first frequency band is a Ku-band of frequencies.

18. The system of claim 17, wherein the second frequency band is a Ka-band of frequencies.

19. The system of claim 18, wherein the at least first receiver can further process off-air television signals.

20. The system of claim 19, wherein the combined IF signal and the off-air television signals have overlapping frequencies.

* * * * *